United States Patent [19]

Scrantom

[11] 4,455,735
[45] Jun. 26, 1984

[54] HIGH SPEED APPARATUS FOR INSERTING ELECTRONIC COMPONENTS INTO PRINTED CIRCUIT BOARDS

[75] Inventor: DeHart G. Scrantom, Shallotte, N.C.

[73] Assignee: AVX Corporation, Great Neck, N.Y.

[21] Appl. No.: 368,670

[22] Filed: Apr. 15, 1982

[51] Int. Cl.³ .................. H05K 3/30; H05K 13/04
[52] U.S. Cl. .................. 29/564.1; 29/741; 29/838
[58] Field of Search .......... 29/741, 564.1, 564.6, 29/564.8, 564.7, 566, 835, 837–839

[56] References Cited

U.S. PATENT DOCUMENTS

| | | | |
|---|---|---|---|
| 2,850,737 | 9/1958 | Walsh | 29/741 X |
| 4,179,803 | 12/1979 | Wolkert | 29/741 |
| 4,329,776 | 5/1982 | Mori et al. | 29/741 |
| 4,403,390 | 9/1983 | Woodman, Jr. | 29/741 X |

*Primary Examiner*—Carl E. Hall
*Attorney, Agent, or Firm*—Arthur B. Colvin

[57] ABSTRACT

The present invention relates to an apparatus and method for the automatic insertion of electronic components, such as capacitors, resistors and the like, into a printed circuit board or an equivalent matrix disposed at a insertion station. The apparatus is capable of rapidly and accurately removing electronic components particularly those having axially extending leads, from a bulk storage supply, forming the leads into the parallel spaced configuration necessary for insertion into a P.C. board, advancing the lead-formed component into a position within the P.C. board stripping the component from the insertion mechanism and reloading a further component into the insertion mechanism.

12 Claims, 28 Drawing Figures

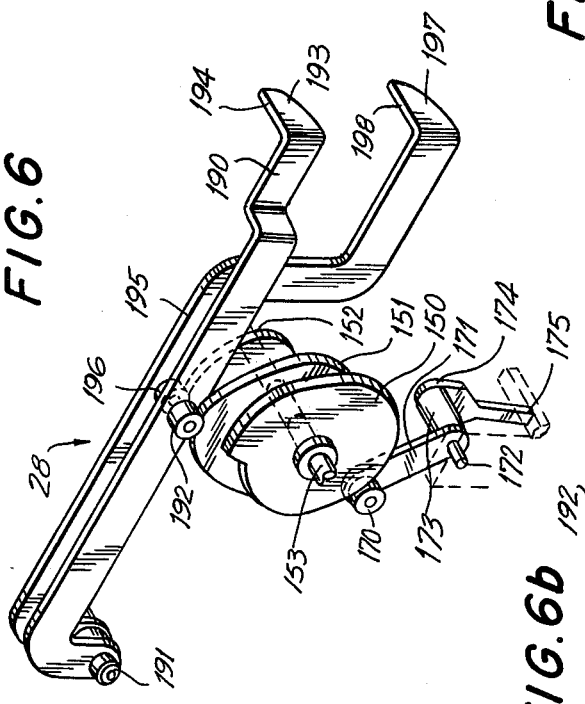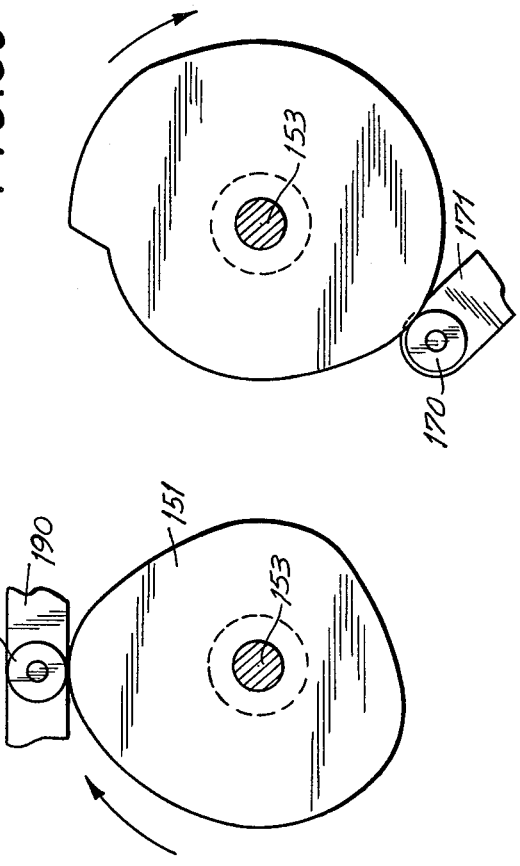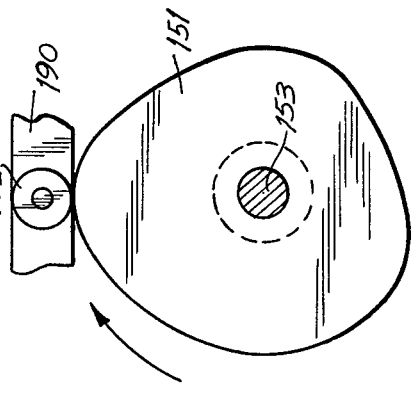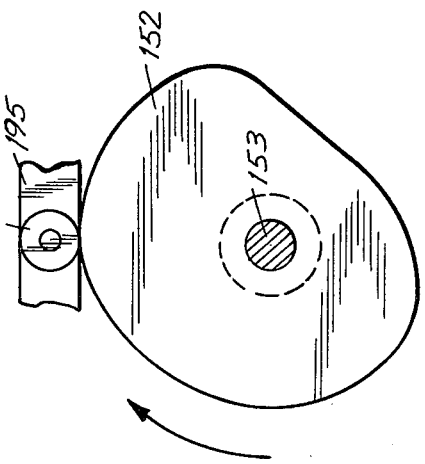

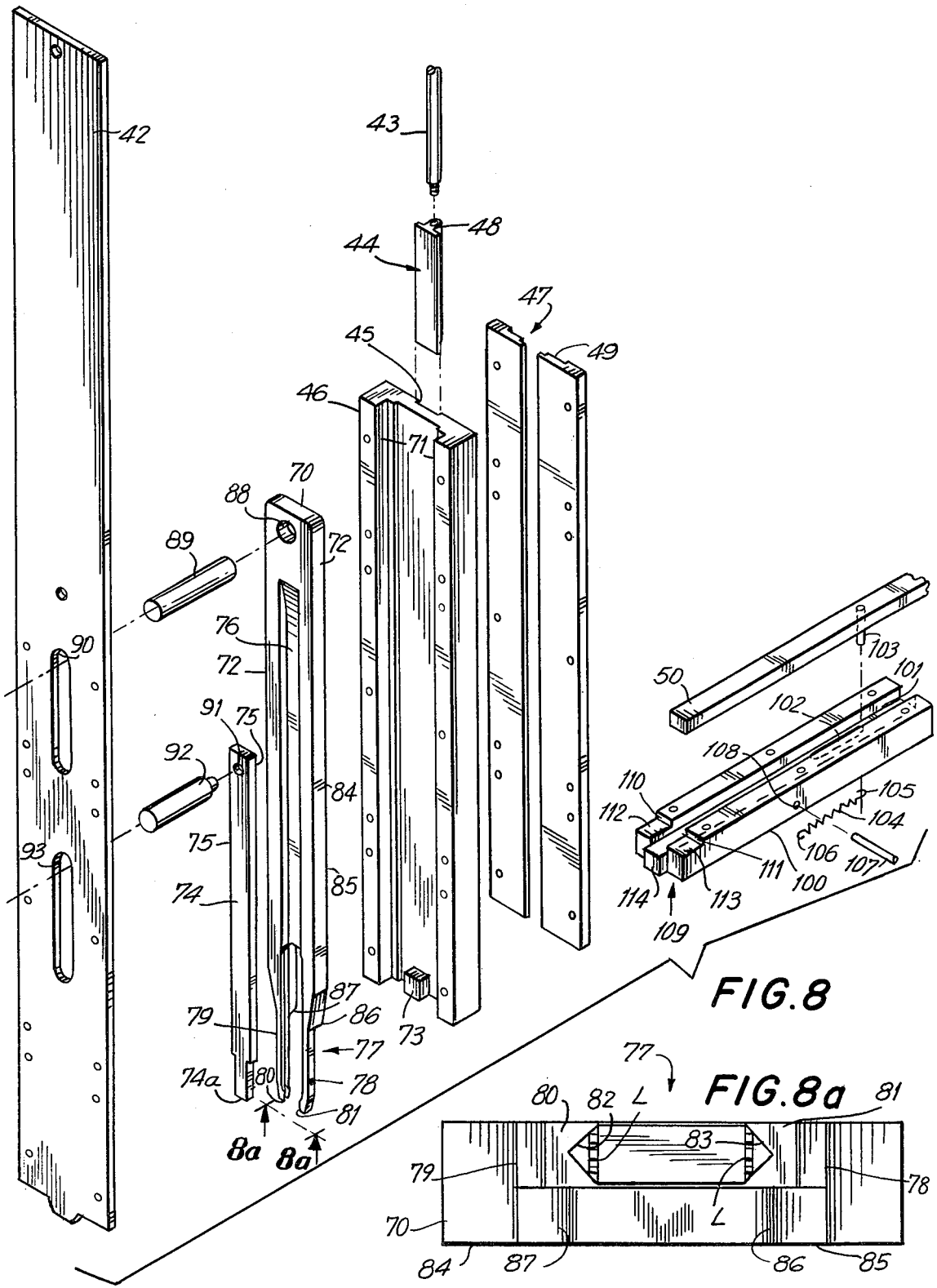

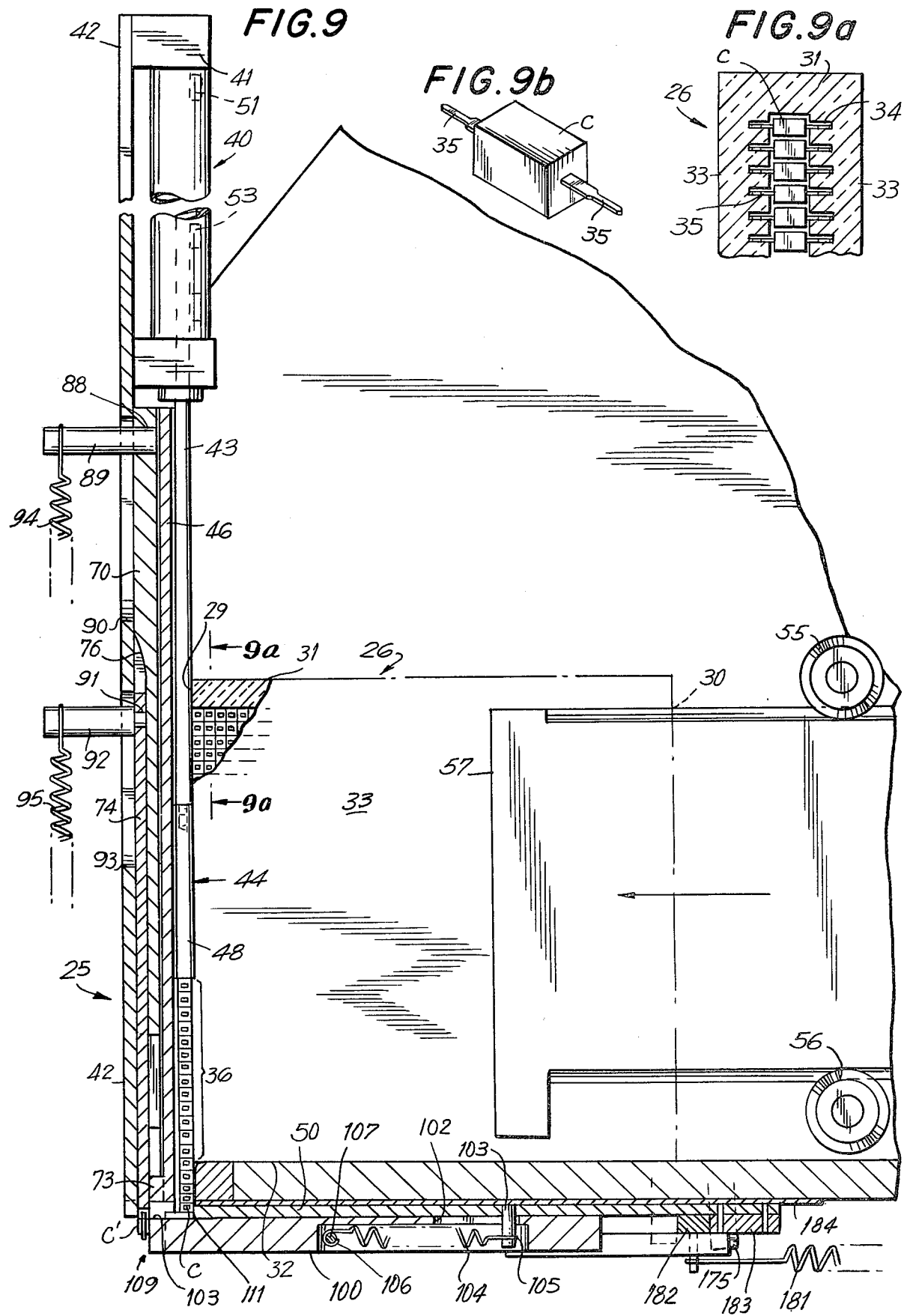

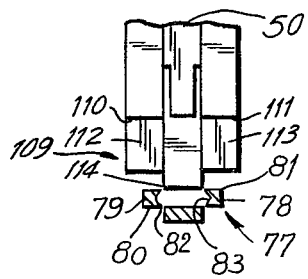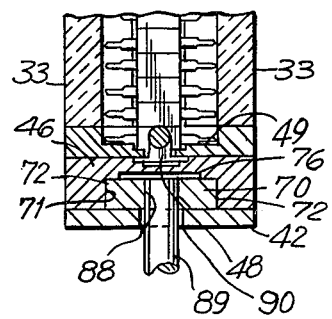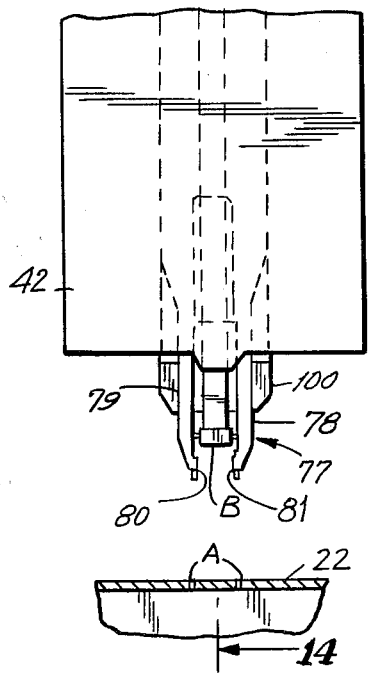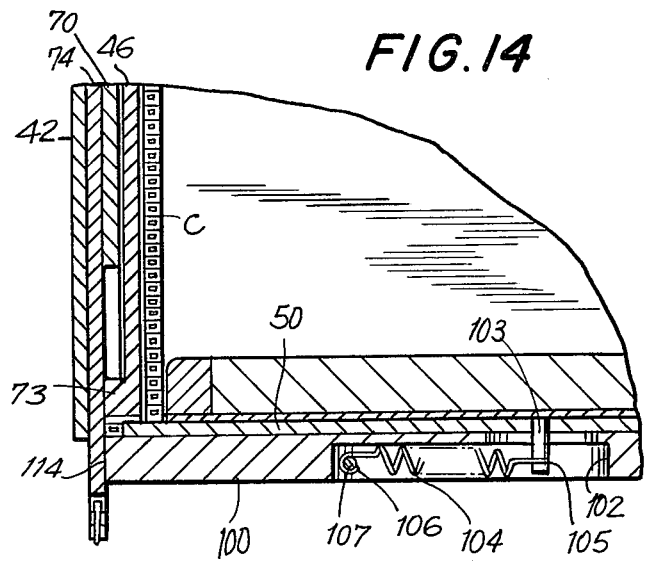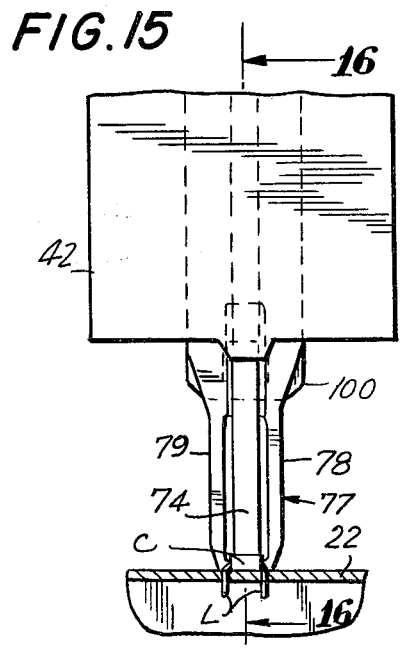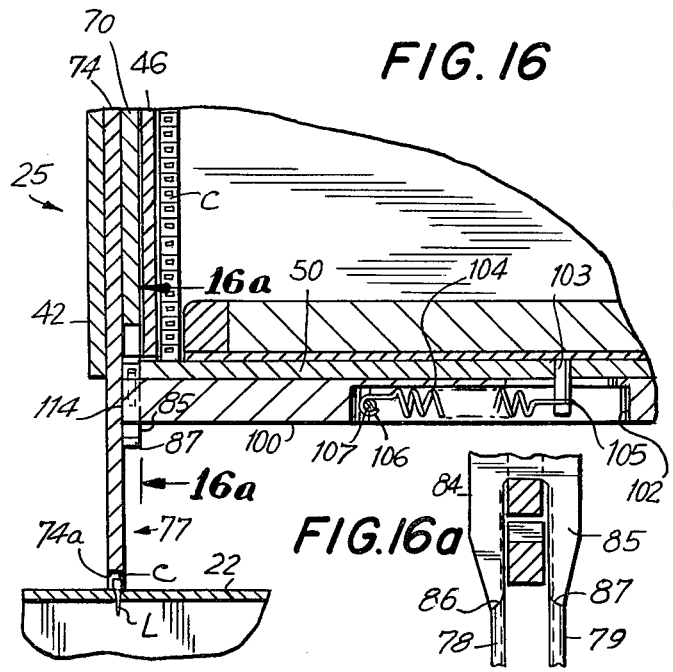

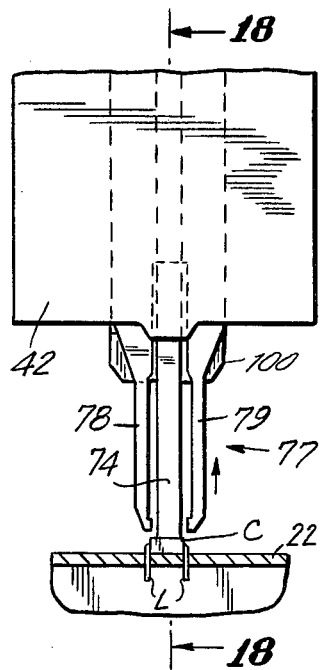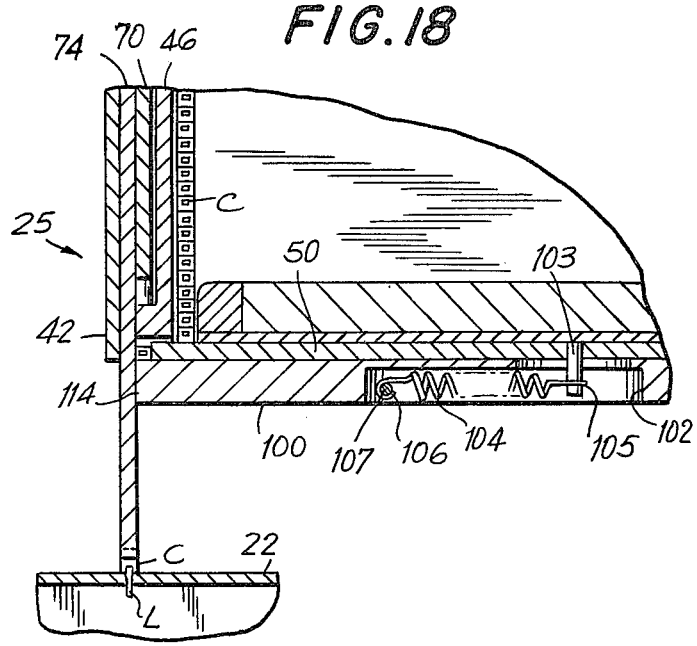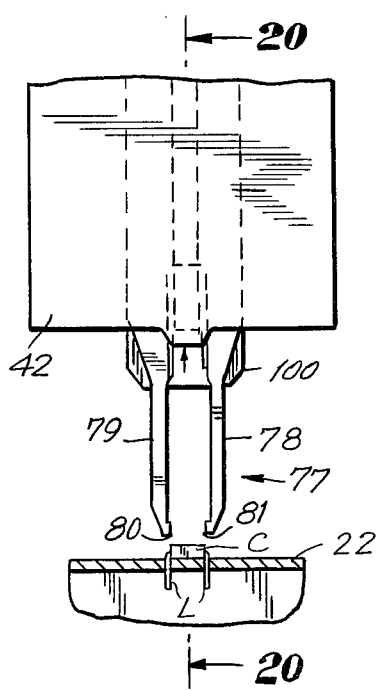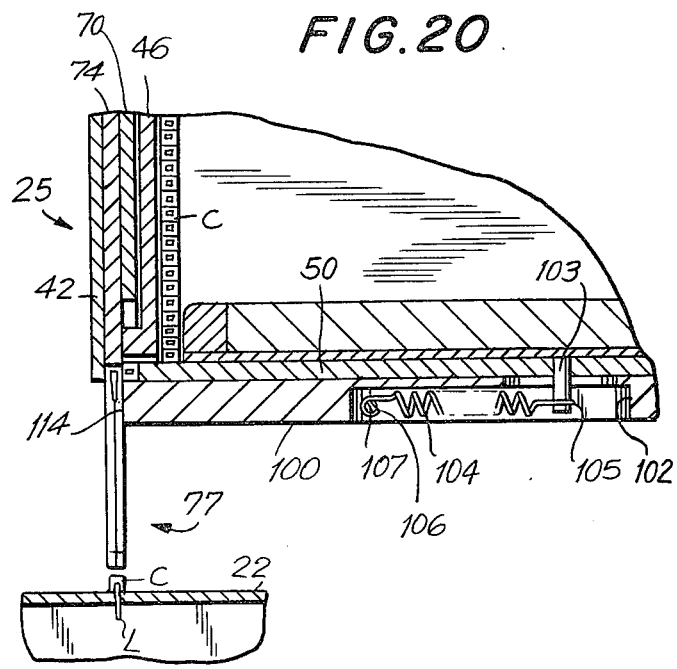

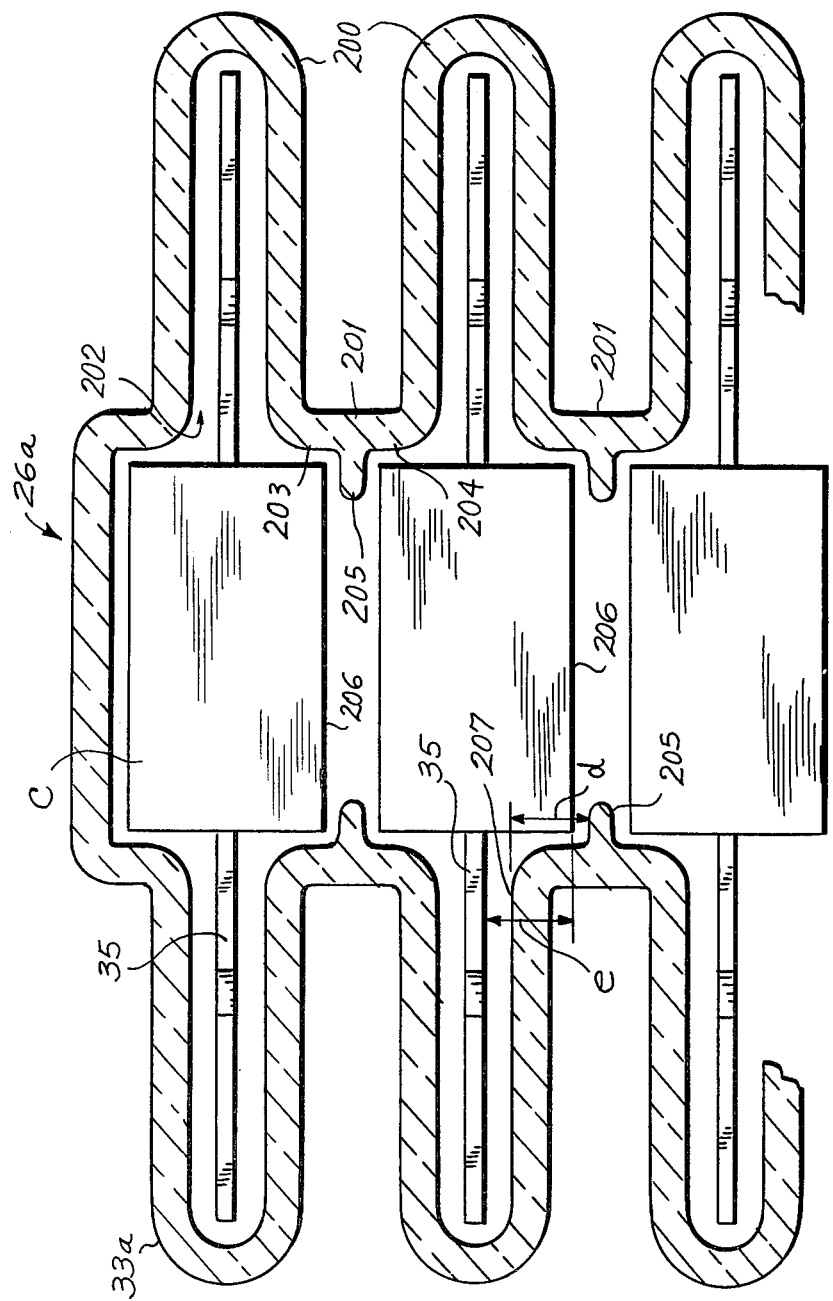

HIGH SPEED APPARATUS FOR INSERTING ELECTRONIC COMPONENTS INTO PRINTED CIRCUIT BOARDS

BACKGROUND OF THE INVENTION

1. Field of the Invention

The present invention relates to an apparatus and method for rapidly and effectively removing electronic components, illustratively capacitors from a bulk supply and inserting the same into terminal apertures formed in a printed circuit board. The invention is more particularly related to an apparatus of the type described characterized in that the components are fed with absolute accuracy, such that, insertion of a component is effected into proper position within the P.C. board during each operative cycle of the device. The invention is further directed to apparatus which is capable of effecting component feed at a rate of 10,000 or more units per hour in contrast to devices now available wherein a production rate of 1,000–2,000 per hour maximum can be achieved.

2. The Prior Art

Electronic circuits are currently typically formed upon printed circuit boards (hereinafter P.C. boards) which, as is well known, comprise a matrix of insulating material having a multiplicity of conductive paths formed thereon. At appropriate positions on the P.C. board there are formed spaced aperatures which register with conductive paths of the board. Assembly of electronic components to the board is effected by inserting the lead portions of the components in bridging relation of appropriate paired apertures. The practice of inserting the components into the P.C. board is known generally as "stuffing" the board.

After the electronic components have been appropriately positioned with the board a solder connection is effected on side of the board opposite that occupied by the components.

Initially, conventional practice involved hand stuffing of the board i.e. electronic components which typically include leads extending axially from the distal ends thereof were formed by bending the leads into right angles to the body portion of the component, the bent leads being manually introduced into appropriate apertures in the board. Manifestly such practice is time consuming.

Subsequent, semi-automated refinements of P.C. board stuffing involved the use of so called X-Y indexing tables which receive a P.C. board and articulate the same through a desired series of orientations each of which was calculated to position an appropriate pair or plurality of apertures in the board directly beneath a filling apparatus. The apparatus utilized in conjunction with such X-Y table grips the appropriate components, the leads of which have already been preformed to a desired configuration i.e. into an essentially parallel orientation wherein the tips of the leads are spaced in accordance with the spacing of the P.C. board apertures. Thereafter the components are advanced toward the board in such manner that the free ends of the leads enter into the desired apertures.

Numerous difficulties inhere in insertion devices heretofore known. Certain such devices grip the component by a body portion thereof and advance the thus gripped component toward the P.C. board. In the event that the lead components are even slightly distorted from a desired spacing and a specific orientation relative to the body of the component, it will be evident that the distal end of the leads will not enter into the apertures of the P.C. board which are of a diameter of perhaps a thirty second of an inch, with the result that the board will be defective. When it is realized that certain boards may contain 100 or more components and that the board will be defective if even one terminal of a single component is not properly inserted, the magnitude of the problem will be better understood.

Further difficulty inhering in apparatus heretofore used to stuff P.C. boards automatically, resides in the difficulty in performing the leads of the components to a desired parallel relationship. If the leads are formed by the component manufacturer to the configuration necessary for insertion into a P.C. board it will be readily recognized that such leads may be deformed or deflected from their initial configuration during shipping or handling. Manifestly, as noted above, any such deformation will preclude proper feeding of the component.

Other apparatus known for the mounting of components in P.C. boards while gripping the leads of the component fail to allow for the possibility that the leads have become distorted in shipment or handling.

Summary of the Invention

The present invention may be summarized as directed to an improved apparatus for stuffing P.C. boards which functions accurately, dependably and rapidly, progressively to remove components stored in a magazine, first to a forming station whereat the leads of the component are deformed from an axial relationship to the body of the component to a predetermined desired parallel relationship. The component with its leads deformed as noted is next led to a feed station whereat the component is received by a feeder head mechanism which functions to the components adjacent their distal ends in such manner that the ends are in intimate relation to portions of the component gripping mechanism and are thus precisely located. The apparatus functions to advance a loaded said component by movement of the feeder head toward a P.C. board which is appropriately positioned, in such manner as to mount the component within selected apertures in the board.

It is an important feature of the invention that in the course of movements of the component toward the board, the component is supported in the feed head by outward springing forces of the parallel leads against gripper portions of the feed head, whereby the leads of the component are self-aligned relative to the head.

The apparatus is provided with a stripper blade member which functions after the distal ends of the leads are passed through appropriate apertures in the P.C. board to continuously urge the component into a mounted position within the board by pressure against the body portion of the component.

In order to assure that the component is not demounted from the board under the frictional forces existing between the head and leads, the apparatus includes mechanism which withdraws the gripper portions from contact with the component while still maintaining the stripper blade in contact with the body portion of the component to thus clear the gripper portion from the component in advance of retractile movement of the stripper blade.

A further advantage of the device which results in a rapid operation and accurate forming of the leads of the component resides in the provision of means for retracting the stripper blade to the feed or loading station of the gripper portion in advance of return movement of the gripper portion to said station. A formed component is advanced to a position under the stripper blade after the blade has returned to the loading station but before return movements of the gripper portions to such station. By this arrangement the lead portions of the components are introduced into the gripper portions of the feed head during return movements of the feed head to loading position and the stripper blade acts during such loading cycle as a stop member against which the body portion of the component may react while the gripper portion returns to its component receiving position.

The invention is further directed to the method of stuffing printed circuit boards which includes the steps of advancing a component having axially directed leads to a forming station, deflecting the leads at such forming station to a parallel condition, advancing the thus formed component to a receiving or loading station, causing the leads to be supported in a bifurcate feed head by outward frictional forces of the leads against portions of the head which are in opposed relation to each other, advancing the thus supported component toward the P.C. board while engaging the body portion of the component with a stripper blade, withdrawing the gripper portions toward the loading position in advance of movement of the blade away from the body portion to effect stripping of the component, retracting the stripper blade to the loading station, advancing a further said component with formed leads into a position between the stripper blade and gripper portions and causing the formed leads of the said component to be engaged by the gripper portions of the feed head in the course of return movements of the gripper portion to the loading station, the stripper blade functioning as a stop or reacting means to assure that the leads of the component are gripped between the opposed faces of the gripper portions.

With the foregoing in mind it is an object of the invention to provide an improved feed device for removing components from a bulk supply and particularly a magazine, forming the components into a proper lead configuration for insertion into a P.C. board, loading the thus formed component into an insertion head, and depositing the formed and loaded component into properly oriented terminal apertures within a P.C. board.

A further object of the invention is the provision of a device of the type described having a bifurcate feed head including depending tines adapted to engage adjacent the distal ends of the leads of a component to be fed whereby the frictional outward forces of the leads themselves function to support the component to the bifurcate head thus assuring that the distal ends of the component are precisely positioned relative to the head.

Still a further object of the invention is the provision of an apparatus of the type described which is capable of rapid cycling whereby insertion rates of 10 to 20 thousand units per hour may be achieved.

Still a further object of the invention is the provision in combination, of an insertion device of the type described and a magazine member wherein a multiplicity of components intended for insertion are carried in such manner that the same may be rapidly stripped from the magazine and fed in a preoriented condition to a forming station whereat the leads thereof are deflected to a desired parallel configuration whereby the possibility of distortion of the leads during handling or shipment is eliminated.

A still further object of the invention is to provide a novel magazine for use with an insertion device of the type described.

In order to attain these objects and such other and further objects as may appear herein or be hereinafter pointed out reference is made to the accompanying drawings in which:

FIG. 6 is a fragmentary perspective view of the drive mechanism of the apparatus.

Figure 5:
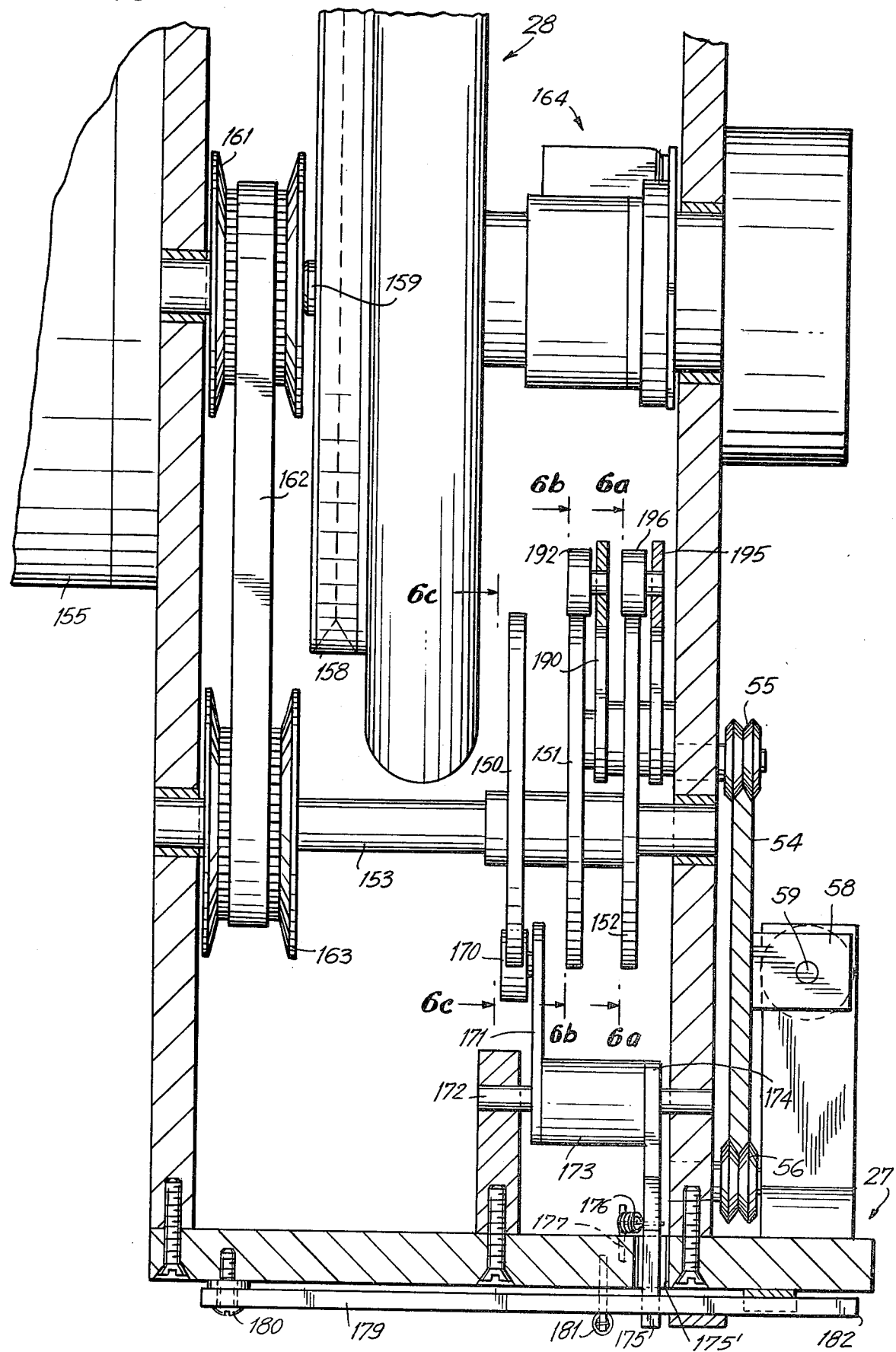
FIG. 5 is a magnified vertical sectional view taken on the line 5-5 of FIG. 4.

FIGS. 6a through 6c are sectional views taken in direction of the arrows 6a-6a, 6b-6b and 6c-6c respectively of FIG. 5.

Figure 4:
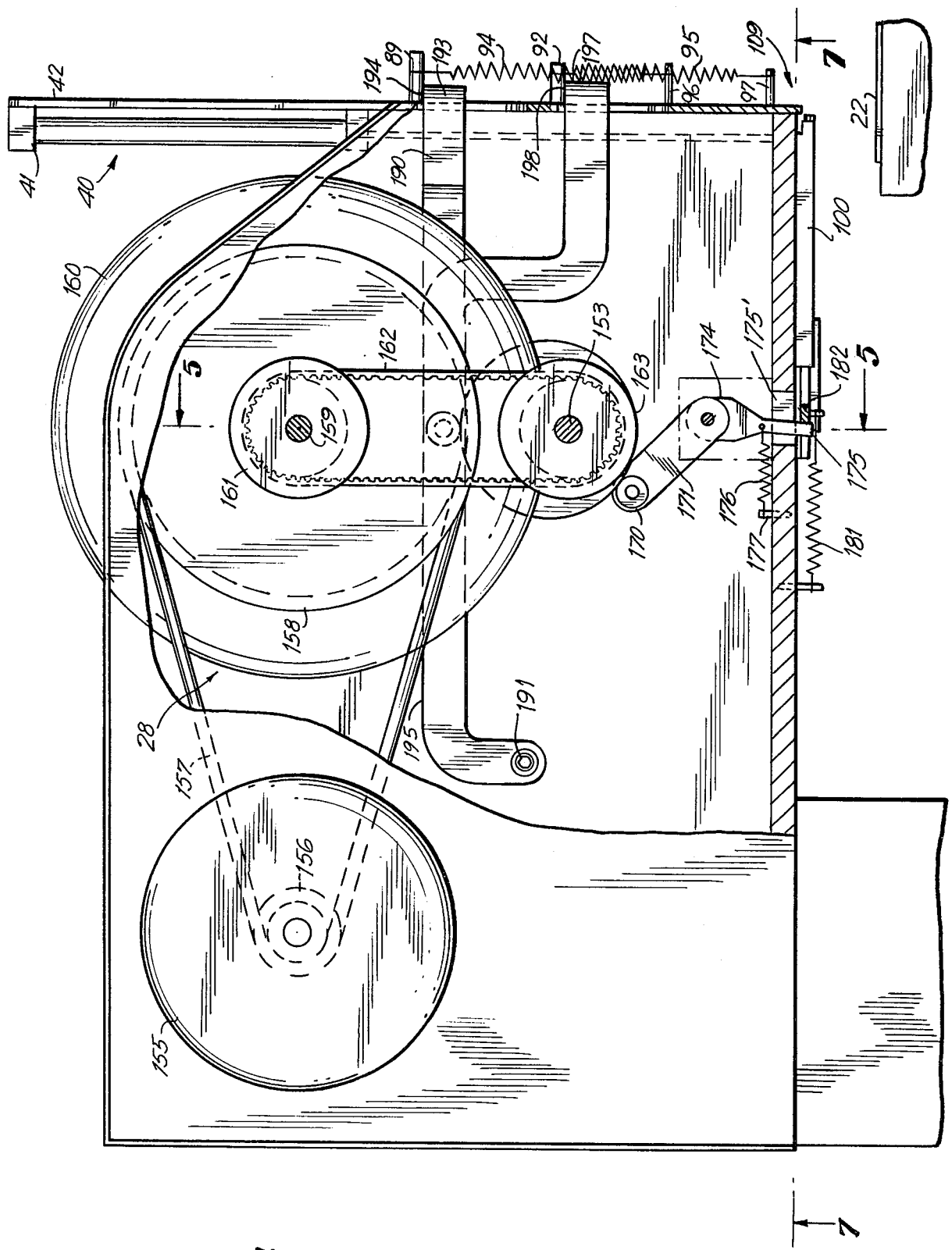
FIG. 4 is a side elevational view taken in the direction of the arrows 4-4 FIG. 2, which portions broken away to show details of construction.
Figure 7:
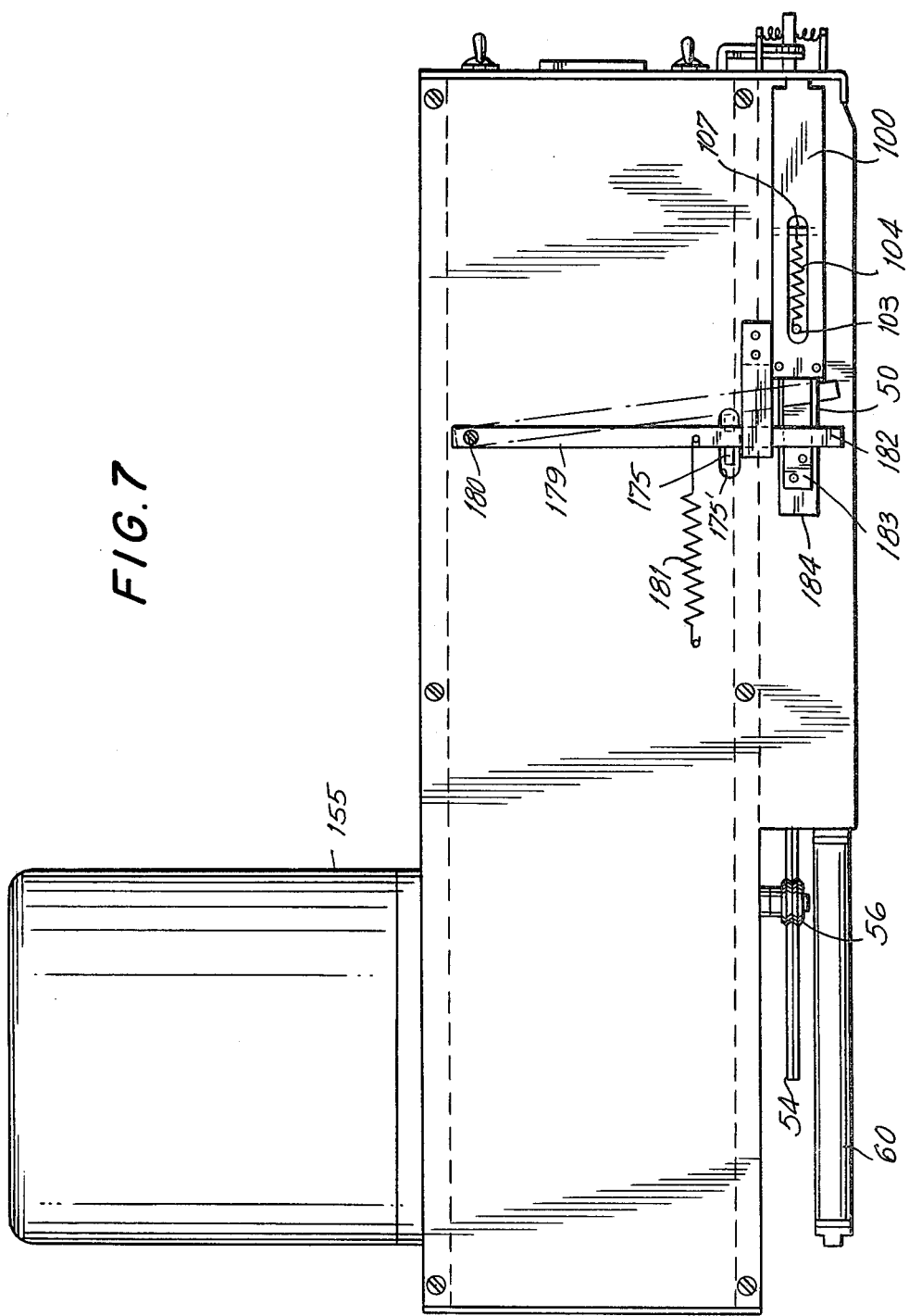

FIG. 7 is a bottom plan view taken along the line 7-7 of FIG. 4.

FIG. 8 is a exploded perspective view of the applicator head mechanism of the device.

FIG. 8a is a bottom plan view on a magnified scale taken in the direction of the arrows 8a-8a of FIG. 8.

Figure 2:
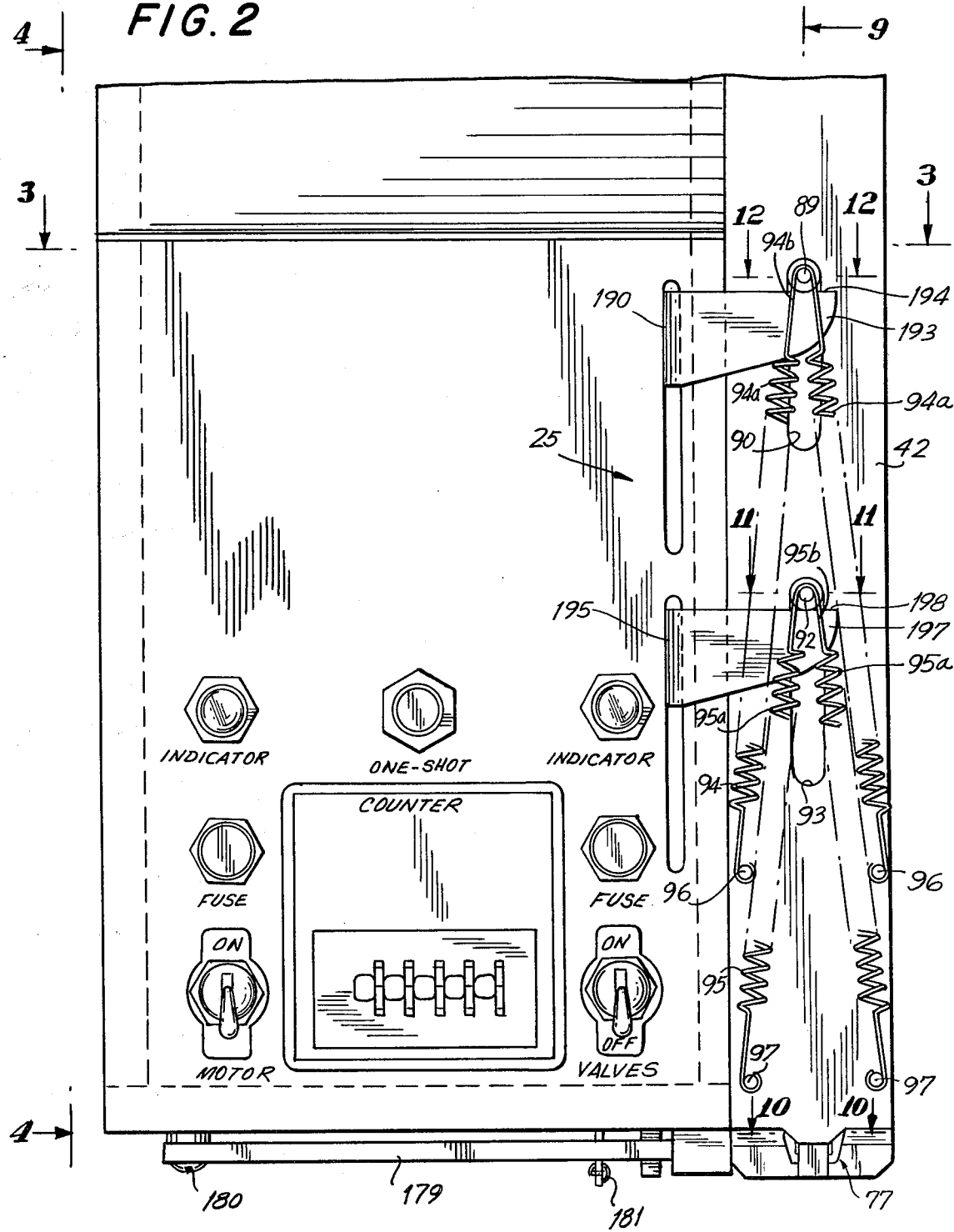
FIG. 2 is an enlarged front view of a fragmentary portion of the machine in the area between the arrows 2-2 FIG. 1.
Figure 3:
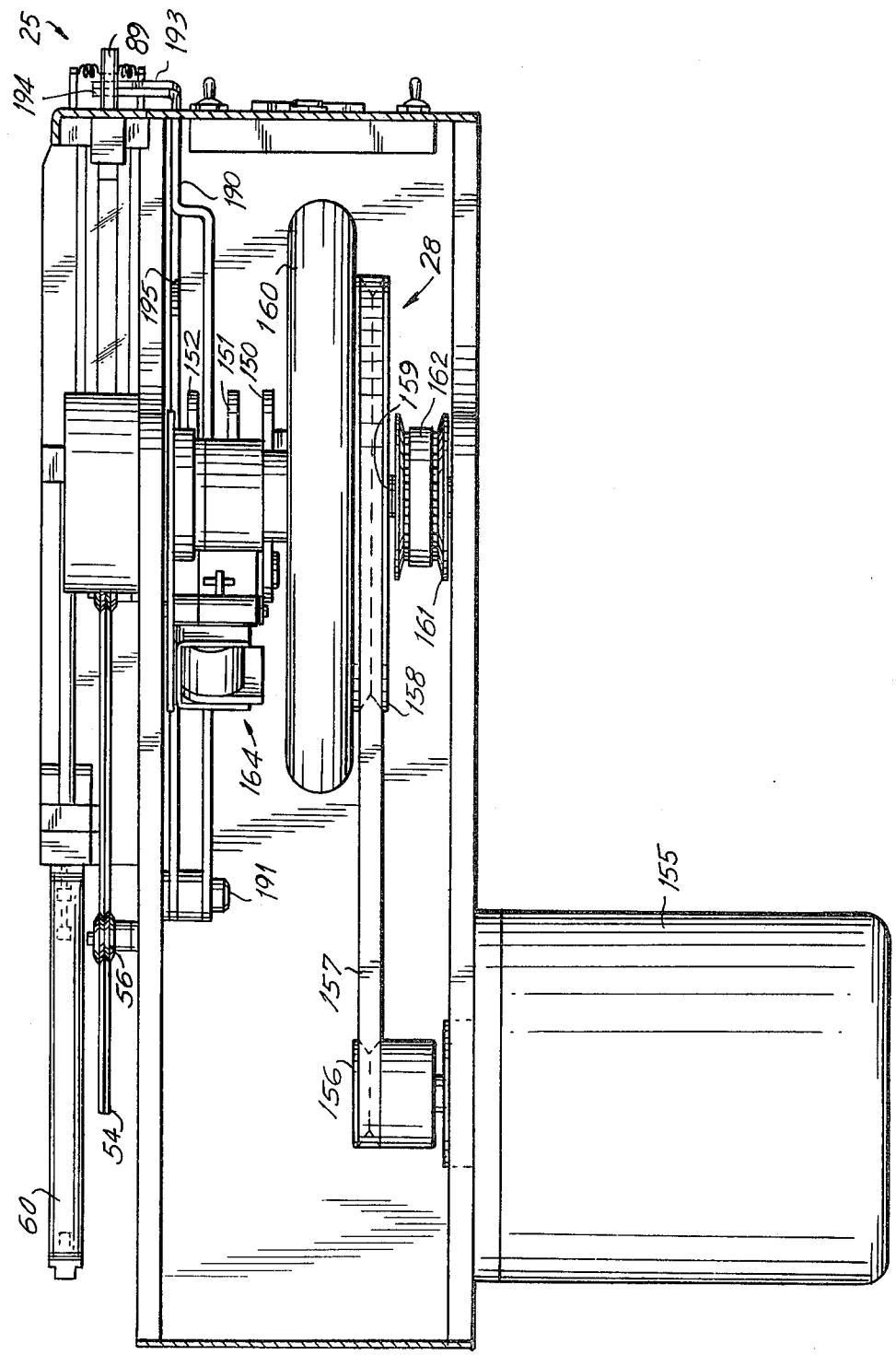
FIG. 3 is a horizontal sectional view taken along the line 3-3 of FIG. 2.

FIG. 9 is a vertical sectional view taken on the line 9-9 of FIG. 2.

FIG. 9a is a fragmentary vertical section on an enlarged scale taken on line 9a-9a of FIG. 9.

FIG. 9b is a perspective view of a representative component to be processed.

FIG. 10 is a horizontal sectional view taken in the direction of the arrows 10-10 of FIG. 2.

FIGS. 11 and 12 are horizontal sectional views taken on lines 11-11 and 12-12 respectively of FIG. 2.

FIG. 13 is a fragmentary front elevational view of the inserter mechanism in a partially downwardly moved postion.

FIG. 14 is a vertical section taken on the line 14-14 of FIG. 13.

FIG. 15 is a view similar to FIG. 13 showing the position of the parts after insertion of a component in a circuit board.

FIG. 16 is a sectional view taken on the line 16-16 of FIG. 15.

FIG. 16a is a fragmentary view taken along the line 16a-16a of FIG. 16.

FIG. 17 is a view similar to the view of FIG. 13 showing the position of the parts after partial retraction of the insertion mechanism.

FIG. 18 is a vertical sectional view taken on the line 18-18 of FIG. 17.

FIG. 19 is a view similar to FIG. 13 showing the position of the parts in a still further retracted position than the position of FIG. 17.

FIG. 20 is a sectional view taken on the line 20-20 of FIG. 19.

FIG. 21 is a fragmentary vertical sectional view similar of FIG. 9a showing a preferred embodiment of magazine assembly.

Figure 1:
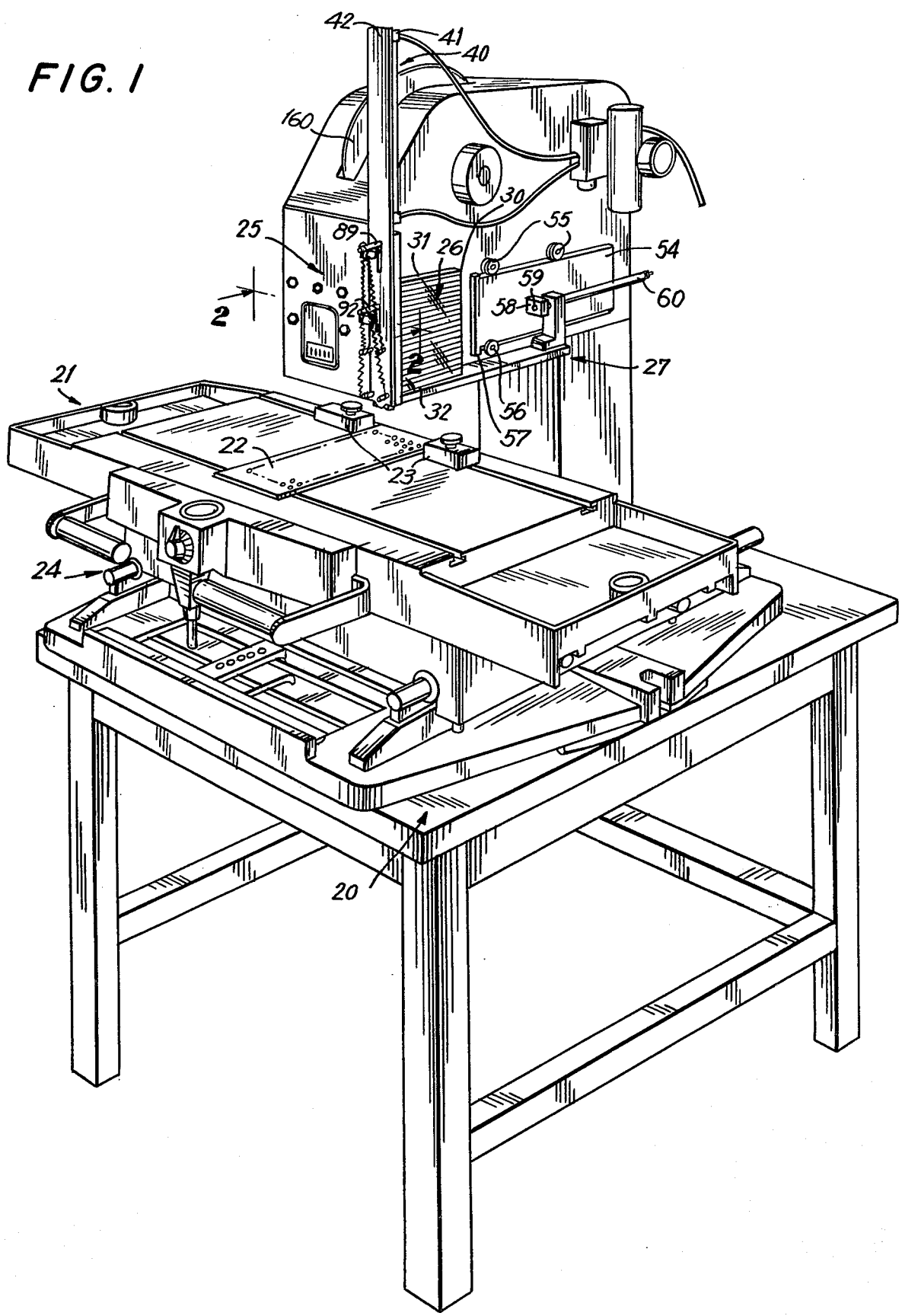
FIG. 1 is an overall perspective view of an insertion device in accordance with the invention.

Referring now to the drawings there is shown in FIG. 1 a frame member 20 on which is mounted an X-Y feed table 21 known per se, feed table 21 functioning to movably support P.C. board 22 and automatically to index the board by movements along an X-Y axis in order to align sequentially selected, respective terminal postions in the board in a predetermined relationship to the insertion apparatus which comprises the subject matter of the instant invention. Since the details of the table and the manner in which the board is moved automatically is known per se a detailed description thereof need not be undertaken. It is merely necessary to note that the board 22 is held between clamp members 23 and that the table carrying the clamps is indexed in accordance with a known pre-programed indexing mechanism 24 and that the board is automatically indexed from position to position for the sequential mounting of components responsive of the completion of an insertion cycle of the insertion apparatus.

Mounted on the table member 20 is an insertion mechanism 25 forming the principal advance of the instant invention. Briefly stated, it is the function of the mechanism 25 to progressively advance from a bulk magazine or carrier 26, individual electronic components, such as resistors, capacitors or the like, from the columnar relation in the magazine initially to a forming station whereat the leads of the components are deflected from an axial alignment with the body of the components to a perpendicular position relative thereto. The thus modified components are advanced from the forming station to an insertion station whereat they are secured to an inserting mechanism which during each cycle of operation advances a component carried by the inserting mechanism toward the P.C. board 22 at an insertion station whereat the two depending leads of the components are introduced into terminal apertures formed in the P.C. board.

The machine generally comprises a magazine feed mechanism 27, the function of which is to advance progressive columns of components stored in ordered arrangement in the magazine into operative positions and sequentially as each column is exhausted, to refill a further column into said operative position.

A principal element of the device is the insertion mechanism which functions progressively to remove the end most member of a column being processed and advance the same to a forming station and in timed relation to move the previously formed component from the forming station to a feed station into engagement with a gripper mechanism which in turn inserts the component into operative position within prepositioned apertures in a P.C. board.

The third element of the apparatus may generally be described as comprising the drive unit 28, which during each sequence of operation actuates the various components of the insertion mechanism 25 in a predetermined timed relation.

Referring now to FIG. 9, the magazine 26 comprises a casing, preferably of molded polymeric material, and open at its front and rear surfaces 29, 30 respectively, the magazine including a top wall portion 31, a bottom wall portion 32 and side wall portions. As best seen in FIG. 9a, side walls 33 which are vertically oriented include horizontally directed slots 34, each of which slots receive the terminals or ends 35 of the components C.

It will be understood that the grooves run substantially the entire horizontal extent of the magazine, and the spaced side walls thus define therebetween an enlarged central portion providing clearance for the body of the components and laterally extending clearance area for accommodating the leads. It will be understood that the lead elements of the components are essentially flat and extend axially beyond the ends of the components, and that the heightwise dimensions of the various slots 34 is such that the elements cannot rotate relative to the magazine. Hereinafter, the horizontally aligned groups of components will be referred to as ROWS and the vertical aligned groups as COLUMNS.

As best seen from FIG. 9, the lead column 36, i.e. the column nearest the insertion mechanism 25, is first exhausted following the exhaustion of which, a second said column is advanced into operative position by the mechanism next to be described. It will be understood that the column 36 is fed seriatim with the lowermost components advanced one at at time to a forming station.

Down feed of the individual components from lead column 36 is effected by an air cylinder member 40 supported on bracket 41 secured to front plate 42. The cylinder rod 43 of the feed cylinder 40 is attached to a magazine stripper plate 44, which rides in a vertically oriented slot 45 in the rear face of a slide track 46.

The magazine stripper is maintained to move in a precise vertical path by a pair of panels which together define back slide cover 47 (See FIG. 8). The magazine stripper includes a rearwardly directed projection portion 48, which extends behind the rearmost surface 49 of the back slide cover. The lead column of components 36 (FIG. 9) is sandwiched between the forwardmost mouth portion 29 of the magazine and the back slide cover 47.

A feed ram member 50 which cyclically removes the lowermost component of the lead column in a manner more specifically described hereinafter, cyclicly removes the lowermost component following which removal the magazine stripper functions to urge the entire column downwardly an increment to fill the space provided by removal of the lowest component. The described downward movement is effected optionally either by a constant downward pressure exerted by the piston rod 43 or by a sequential activation of the cylinder 40 triggered by mechanism tied to the cyclical operation of the inserter components hereinafter described.

The piston mechanism 40 includes a magnetically triggered switch apparatus, the function of which is to recycle the piston rod 43 raising it to its uppermost position after a sensed exhaustion of the last of the components in the lead column 36. The switching mechanism may include an upper limit switch member 51 and a lower limit switch mechanism 52, the said mechanisms 51 and 52 being mounted on the walls of the cylinder member 40. A trigger mechanism 53 is secured to the piston rod. When the member 53 reaches a precise vertical aligned position as respects the member 52 signifying that the column 36 has been exhausted, the switch mechanism is activated causing the piston rod 43 to retract within the pistion 40. When the movable member 53 assumes a position opposite the upper trigger 51 signifying the uppermost position of the piston rod in the piston, there is next activated the pusher mechanism 27 which functions in the manner hereinafter set forth to feed a further column forwardly such that the next column becomes the lead column 36.

As best seen in FIG. 1 the column feed mechanism 27 includes a guide plate 54 mounted for translatory forward and rearward movement between upper and lower paired guide rollers 55,56 respectively. The plate 54 includes a pusher member 57 which precisely fits within the space defined between the side walls 33,33 of the magazine. A bracket member 58 extends laterally from the plate 54, the bracket being connected to the lead end of a magazine feed piston rod 59 extending from air cylinder 60. The cylinder 60 is activated by the closing of the switch mechanism 51 to shift the next to be lead column 36 forwardly, so that the lead column 36 is forced out of the magazine and against the back surface 49 of the back slide cover 47.

There will next be described the insertion mechanism forming a principal advance of the invention which functions to sequentially remove the lowermost component from the lead stack 36, to form the component by downwardly deflecting the component leads into a parallel depending orientation, to advance the formed component to a position to be received by the insertion mechanism proper and insert the properly positioned leads of the component into the P.C. board.

The elements which comprise the insertion mechanism are best understood from an inspection of FIGS. 8 through 16. Such elements include a vertical slide track 46 which is made fast to the front plate 42, which slide track slideably carries a plunger or insertion member 70. The slide track 46 includes vertically directed opposed guideway surfaces 71,71 which slideably guide the side surfaces 72,72 of the insertion member 70 to assure precise vertical movement of such member.

The slide track 46 includes at its lowermost end a stop block 73. A stripper blade member 74 includes parallel side walls 75 which are guided for vertical sliding movement within the groove portion 76 formed in the inserter member 70.

The lower end 77 of the inserter member 70 is formed in a bifurcate configuration which includes spaced depending tines 78,79. The lowermost ends of the tines 78,79 have inwardly directed gripper toes 80,81, the spacing between the toes being smaller than the spacing between main lengths of the tines 78,79. As best seen in FIG. 8a, the toes 80,81 include opposed vertically directed generally V-shaped grooves 82,83 respectively.

As will be noted from FIGS. 8, 9, 14 and 16 the tines 78,79 of the inserter member 70 occupy less than the full thickness of the body portion 84 of the plunger or insertion member. More particularly, the rear face 85 of the insertion member includes a pair of rearwardly projected, horizontally disposed shoulders 86,87 which are rearwardly offset from the tines 78,79. The shoulders 86,87, as best seen in FIG. 16, are inclined upwardly and inwardly to provide caming surfaces which function in the course of operation of the device as forming edges for the downward deflection of the leads of the components to be fed.

The insertion member includes a drive aperture 88 adjacent its upper end, within which aperture is mounted a drive pin 89, the pin extending forwardly through a vertically directed slot 90 formed in the front plate 42. In similar fashion, the stripper blade 75 includes a drive aperture 91 carrying drive pin 92 guided for vertical sliding movement within the slot 93 in the front plate 42.

The pins 89 and 92 provide anchor points for spring members 94 and 95 respectively, which are biased between the pins and fixed anchor portions or pegs on the forward surface of the front plate 42. More specifically, and with reference to FIG. 2, the spring 94 controlling the inserter member 70 includes legs 94a-94a and a bight portion 94b which overlaps the pin 89. The bottom ends of the spring branches 94a are secured to tension pins 96-96 projecting forwardly of the plate 42.

In similar fashion the spring 95 includes side branches 95a, a bight portion 95b overlapping pin 92 and lower end portions secured to tension pins 97-97. As will be apparent from the foregoing description, the inserter member and the stripper blade are normally urged downwardly by the spring assemblies 94 and 95.

Lateral feed of the components to be formed and inserted is effected by a feed slide assembly 100, see FIG. 8. The feed slide assembly includes a horizontally directed groove 101 having a vertically oriented slot 102 formed therethrough. The feed ram 50 previously described is mounted in the slot 101 and is provided with a depending stop pin 103 which extends downwardly through the groove 102, it being understood that the horizontal movement limits of the feed ram 50 are controlled by the movements of the pin 103 in groove 102. The feed ram 50 is normally urged forwardly by a ram spring 104, the distal ends 105, 106 of which are engaged repectively with pin 103 and an anchor pin 107 mounted in side bore 108.

The front end 109 of the feed slide includes a spaced pair of forwardly directed, vertically extending shoulders 110,111 adjoining spaced horizontal pallet portion 112,113. Additionally, the forwardmost end of the slide defines an anvil portion 114, being the element about which the leads of the components are bent prior to the feeding thereof to the P.C. board.

There will next be described with particular reference to FIGS. 9 and 10 through 20, the various sequential steps involved in the bending of the component leads and the insertion of the bent leads into final position. The driving mechanisms which urge the described components through the various positions in the sequences noted will be described hereinafter. The sequence of forming and feeding steps will be described beginning with the ready position illustrated in FIG. 9, i.e. with a first component C' the lead portions of which have been previously formed in the apparatus, mounted within and supported by the gripper portions 82,83 of the bifurcate end of the inserter member.

As best seen in FIG. 8a, the leads L of the component to be formed are generally in the form of a flat web pointed at the distal ends. After formation, and by virtue of the natural resilience of the leads which have been bent to the parallel configuration shown for instance in FIG. 13, the component tends to retain itself between the toes or gripper portions 82,83 by the outward forces exerted by the leads. In the position of FIG. 9, both the inserter member 70 and the stripper blade 74 are depicted in their uppermost limiting positions. Upon initiation of an actuating cycle the inserter member 70 and the stripper blade 74 move downwardly conjointly. In the course of such movement, it will be seen with particular reference to FIG. 13 for example, that the lowermost end 74a of the stripper blade is in engagement with the body portion B of the component C.

After the blade and inserter member have decended together for a distance, the feed mechanism causes the ram 50 to shift the lowermost component C forwardly from the position shown in FIG. 9 to the position shown in FIG. 14. Whereas such lowermost component previously had its leads resting on the pallets 112,113 the described feed action of the ram has caused the body to rest on the anvil 114, the axially directed leads now being unsupported and in alignment with the forming cams 86,87 on the rear face of the inserter member 70. It will thus be seen that with continued downward movement of the inserter member the leads L-L of the component C will be deflected downwardly over the anvil 114 by the forming members 86 and 87.

Continued downward movement of the inserter member and stripper bar results in the leads of the component C' being passed into appropriately positioned terminal apertures A in the printed circuit board 22 held in the indexing table. After completion of the insertion step, the drive mechanism causes the insertion member 70 to rise independent of movement of the stripper blade 74 from the positions shown in FIGS. 15 and 16 to the positions shown in FIGS. 17 and 18. It will thus be seen that any tendency of the fed component to be lifted clear of the printed circuit board is overcome by the action of the stripper blade 74, which maintains the component in its downwardmost position until the component has been cleared from contact with the bifurcate tines of the inserter member.

After the component has been cleared from its position between the tines, the drive mechanism causes the stripper blade 74 to rise at a more rapid rate than the rising movement imparted to the inserter member 70. This position of the parts is shown in FIG. 19.

After the stripper blade has reached its uppermost limiting position, as seen in FIGS. 19 and 20, the feed ram 50 is caused to move further forwardly toward the front plate 42, inducing the component C which has had its leads deflected downwardly during the inserting stroke of the capacitor C', to shift forwardly against the front plate 42 and in the vertical plane between the tines 78, 79 of the insertion member.

It will be noted that the spacing of the tines throughout the main vertical extent thereof is greater than the spacing between the toe portions 81,82 and thus a clearance area is provided permitting the formed capacitor or other component to be disposed between the tines. It will further be appreciated that the component C, whose leads have been formed and which is positioned in the space bounded by the tines, is blocked against undue upward movement by the lowermost end portion 74a of the stripper blade. Now, when the inserter member returns to its uppermost position as represented in FIG. 9 the leads of the component will be frictionally engaged between the toe portions 82,83 as shown in FIG. 8a, whereupon the thus mounted component will be positioned to be fed to the printed circuit board during the next cycle. The guiding of the leads of the component C into retained position on the insertion member is facilitated by the angled configuration of the opposed faces of the tines.

From the foregoing it will be appreciated that the stripper blade acts, following feeding of a component to the P.C. board to clear the inserter member from the component by precluding the component from moving upwardly with the inserter member, and thereafter returns to its raised position in advance of the inserter member to define an upper stop against which the component reacts while the leads of said component are forced between the gripping toes of the inserter member. It will be further apparent from an inspection of the sequential views (FIGS. 10-20) that the feed ram 50, during each operative cycle moves through two discrete forward steps, namely a first step in which the lowermost component of the column 36 is advanced to the forming station over anvil 114 during initial downward movements of the blade and inserting member, and a second forward movement of the then formed component into aligned orientation between the tines 78,79 after the blade has returned to its uppermost position and before the bifurcate member rises completely to the feed station. To facilitate understanding of the device, the area over the anvil 114 is referred to as a forming station, the area where the formed component is mounted between the tines is referred to as a feed station, and the area where the component is actually introduced into the P.C. Board is referred to as an insertion station.

There will next be described the drive mechanism which effects the sequential shifting of the various feed, insertion and stripping elements referred to above. The drive mechanism is timed by a cam and lever arrangement shown in perspective in FIG. 6.

The operating cams 150,151 and 152 operate respectively the feed ram 50, the inserter assembly 70 and the stripper blade 75. The cams 150 through 152 are mounted on a timing drive shaft 153 which is driven through a single revolution in each operative cycle.

There will next be described the mechanism for effecting the single rotary cycle of the shaft 153. Operative power is derived from electrical motor 155 which is constantly running and through drive pulley 156 and drive belt 157 is coupled to enlarged pulley 158, which is rotarily mounted on shaft 159. The pulley 158 is coupled to a weighted fly wheel 160.

Mounted on shaft 159 for relative rotation with respect thereto is a timer pulley 161 connected via timing belt 162 to pulley 163 coupled to shaft 153. A one revolution clutch member 164 which is electrically operated and which is known per se is mounted on shaft 159.

As is well understood by those skilled in the art, upon the reception of an electrical triggering current the clutch 164 functions to couple the timer pulley 161 to the pulley 158 so that a conjoint single revolution of the parts is effected. Of course, in turn, single rotation imparted pulley 161 functions to rotate pulley 163 through a complete revolution and accordingly the shaft 153 carrying the cams 150 through 152.

The ram feed mechanism is driven via the cam 150 which in turn has a surface engaging follower 170 disposed on an end of bell crank lever 171 pivotedly mounted at 172. A lateral offset shaft 173 is coupled at its end 174 to a feed finger 175. The follower 170 is maintained in contact with the surface of cam 150 as by tension spring 176 reacting between the 175 finger and a setting pin 177 secured to the frame of the machine (FIG. 4).

Referring now to FIGS. 4, 7 and 9 it will be seen that the depending feed finger 175 extends through slot 175' in the base plate of the device and bears against the rearmost surface of a cross-lever 179 pivotedly mounted at 180. The lever is normally urged rearwardly into a engaging position against the finger 175 as by tension spring 181.

The free end 182 of the lever 179 is engaged against a depending drive plate 183 secured to the rear end 184 of the ram 50. It will thus be perceived that when the lever 179 articulates between the solid and dot and dash position shown in FIG. 7, the spring member 104 previously described maintains the plate 183 in contact with the rear face of the lever 179. Thus the force of spring 104 drives the ram forwardly when it is released as by forward movement of the lever 179. It will further be understood that the movement of the finger 175 and consequently the movement of the lever 179 will be dependent upon the surface configuration of the cam 150.

The movements previously described of the inserter member are controlled by lever 190. The lever 190 is pivotedly mounted at its rearward end on a cross-shaft 191 made fast to the frame of the machine. The lever includes a follower portion 192 which rides on the cam surface of the cam 151. The lever 190 includes a lift finger 193 which extends forwardly of front plate 42 and beneath the previously described drive pin 89 secured to insertion member 70. It will thus been seen that the spring assembly 94 which acts against pin 89 will maintain the pin 89 in contact with the upper surface 194 of distal end 193 of lever 190.

In similar fashion the stripper blade member 74 is positionally controlled by a lift lever 195, which likewise is mounted on the cross-shaft 191. The lever 195 includes a follower 196 which engages the periphery of cam 152 and includes a forwardly directed arm 197 outwardly paralleling front plate 42 and having an upwardly facing surface 198 which underlies the drive pin 92 of the stripper blade.

The drive mechanism above referred to during each rotation of the three cams 150, 151 and 152, functions to move the ram 50, the insertion member 70 and the stripper blade 74 through one complete cycle of operation. It is to be observed that in each instance the levers function to cock springs which drive the respective components through an operative cycle rather than forcing the components through the operative cycle. This arrangement assures a high degree of reliability and minimizes the possibility of damage to machine components.

It will be readily recognized by those skilled in the art that the cam and lever drive mechanism illustrated and described is merely illustrative of one expedient which may be employed to effect the various sequential movements of the parts. By way of example, each and every one of the movements may be effected through the use of appropriately selected and positioned air cylinders, solenoids or the like. The illustrated drive mechanism thus is not to be considered in a limitative context.

In FIG. 21 there is disclosed a preferred form of magazine configuration. The device of FIG. 21 is particularly advantageous in that feed of the components C is independent if possible irregularities in the component leads 35 such as burrs etc.

In the magazine of FIG. 21, which may comprise a short section severed from an elongate extrusion of polymeric material, the sidewalls 33a–33a are of a corrugated or sinuous configuration and include projections 200 and recess portions 201. The projections 200 on their interior surfaces include horizontally directed channels 202 providing clearance for the leads 35 of the capacitors C.

The inner faces 203 of the recess portions 201 define vertical wall portions 204. Centrally of each wall portion 204 is formed a horizontal rib or ledge 205, an opposed pair of ribs or ledges 205 being in coplanar alignment and providng a support for the base or flat bottom portion 206 of the capacitors C.

The vertical distance d, between the upper surfaces of ribs 205 and the upper surface 207 of the wall defining the bottom of channels 202 is smaller than the distance e, between the base 206 of the capacitor c and the undersurface of the lead 35. As a result, the capacitors ride with their base surfaces supported on ribs 205, in which position the leads 35 are clear of contact with any portion of the magazine 26a and are susceptable of being fed without interference.

The capacitors are non-rotatable relative to the magazine by virtue of the rectangular section of the body portion of the capacitors and preferably also by virtue of the fact that the contact portions being of a greater horizontal extent than the heightwise dimension of channels 202.

Obviously, the horizontal spacing of ribs 205 is sufficient to permit forward movement of the pusher member 57. The operation of the magazine of FIG. 21 insofar as its interaction with the remaining components of the device is exactly the same as described in connection with the magazine of FIG. 9a.

As will be clear from the proceeding description, the method of handling and feeding the components into operative position within a P.C. board embodies a novel methodology as well as novel mechanical apparatus. More specifically, the concept of providing axial lead components, forming the leads of the components into parallel spaced relation; supporting such leads by the reliance upon the outward springing forces of the leads against a bifurcate carrier, advancing the bifurcate carrier while backing the body portion of the component until the leads are inserted into desired position; withdrawing the bifurcate carrier while maintaining the stripper in position adjacent the P.C. board to thus clear the carrier from the component; returning the stripper blade to a position against the next to be fed component and reloading the bifurcate carrier during the return stroke thereof by introducing the just formed component into the space between the stripper blade and the rising bifurcate carrier, comprise a series of novel method steps which together enable the rapid and accurate feed of components, such as capacitors, into aligned position in P.C. boards.

A highly advantageous aspect of the instant apparatus and method resides in the fact that the leads of the components are engaged immediately adjacent the distal ends thereof by the insertion member. The intimate juxtaposed position of the contact area between the insertion member and leads assures that the distal ends to be inserted into position within the P.C. board correlate with a high degree of accuracy with the insertion member. The apparatus is thus enabled to compensate for distortions of the leads without compromising insertion accuracy. In contrast insertion devices heretofore known, wherein contact between the component to be fed and the insertion mechanism is effected by gripping of the body portion of the component, are highly dependent for accurate feed on the disposition of the leads. If the leads are twisted or distorted in manufacture, shipping or handling they will not register with the apertures of the P.C. board notwithstanding accurate correlation of the feed head and P.C. board.

In contrast to insertion devices heretofore known which operate at a maximum feed rate of up to about 2,000 per hour, apparatus in accordance with the present invention is capable of inserting between 10 and 20 thousand units per hour.

The principal advantages of the present apparatus are realized when the same is employed with printed circuit boards wherein a multiplicity of capacitors or like components of the same value are to be inserted. In other words, it is assumed that the magazine of the instant apparatus will be charged with components of a given fixed value and that during each operative cycle the apparatus will be programed to index a given P.C.

board into as many positions as may be necessary for insertion of components of the given value. Obviously, after such components have been inserted the partially filled boards may be reprocessed in a second such apparatus where components of a different value are to be positioned.

The preceeding apparatus and method are considered to define a new useful and unobvious approach to the rapid and accurate feeding of components into predetermined position within printed circuit boards. As will be evident to those skilled in the art, the utility of the insertion apparatus is not limited to the use in conjunction with printed circuit boards. Rather, the term P.C. boards or printed circuit boards as used herein should be interpreted to include equavelent environments, chassis or matrixes within which components may be received.

It is to be understood that the specific embodiment hereinbefore described has been incorporated by way of example only and in compliance with the requirements of the Patent Laws. Numerous changes, modifications and variations in construction will readily occur to those skilled in the art and familiarized with the instant disclosure. Accordingly, the invention is to be broadly construed within the scope of the appended claims.

The embodiments of the invention in which an exclusive property or privilege is claimed are defined as follows:

1. Apparatus for the automatic insertion into a P.C. board positioned at an insertion station of an electronic component, such as a capacitor, or the like having a central body portion and axially extending leads, comprising a component supply station, means for storing a multiplicity of components in parallel stacked condition at said supply station, a forming station downstream of said supply station, first means for cyclicly feeding an endmost component from said stack to said forming station, a plunger member cyclicly shiftable toward and away from said insertion station, said plunger including a forming portion and a feeding head positioned to move in a path adjacent said forming station and feed station respectively on movements of said plunger toward and away from said insertion station, means on said forming portion for deflecting the leads of a component at said forming station into a substantially parallel depending condition responsive to movement of said plunger toward said insertion station, second feed means for advancing a formed said component from said forming to said feed stations in advance of return movement of said plunger from said insertion station to said feed station, and bifurcate means on said feeding head having gripper portions for receiving a formed said component at said feed station by engagement with said parallel leads responsive to movement of said plunger away from said insertion station.

2. Apparatus in accordance with claim 1 wherein the spacing of said gripper portions of said bifurcate means is less than the spacing of said leads of a component leaving said forming station whereby said leads are frictionally retained between said gripper portions responsive to return movements of said head to said freed station.

3. Apparatus in accordance with claim 2 and including a stripper blade movable relative to said plunger in a path between said bifurcate means in a direction toward and away from said insertion station, said blade being moved conjointly with said bifurcate means during movements of said bifurcate means toward said insertion station and means for retaining said blade adjacent said insertion station during initial return movements of said bifurcate means away from said insertion station to thereby disengage a said component from said gripper means during said initial return movements of said bifurcate means.

4. Apparatus in accordance with claim 3 and including lift means for shifting said blade away from said insertion station in advance of said bifurcate means returning to said feed station.

5. Apparatus in accordance with claim 4 wherein said lift advances said blade to a position immediately above said feed station, whereby the body portion of a component advanced to said feed station is interposed in the path between said blade and said insertion station in advance of return movement of said bifurcate means to said feed station.

6. Apparatus in accordance with claim 5 wherein said blade defines a stop portion against which said body portion of said component reacts when said bifurcate means returns to said feed station.

7. Apparatus in accordance with claim 1 wherein said means for storing said components at said supply station comprises a magazine, said magazine including spaced parallel side wall portions defining a vertical clearance area for the body portions of said components, said side wall portions including opposed mutually aligned recessed parallel track portions adapted to receive said axial leads.

8. Apparatus in accordance with claim 7 wherein said leads are non-circular in transverse section and the vertical dimension of said track portions is such as to permit movement of said components longitudinally of said track portions but to lock said components against rotation relative to said track portions.

9. Apparatus in accordance with claim 8 wherein said leads are generally rectangular in transverse section.

10. Feed head apparatus for automatically inserting the leads of a component such as a capacitor into prepositioned terminal apertures of a P.C. board at an insertion station comprising a bifurcate member having spaced depending tines, opposed inwardly facing gripper portions at the distal ends of said tines, means for inserting a component having depending parallel resilient leads into frictional engagement with said gripper portions whereby said component is supported solely as a result of the outward biasing forces of said leads against said gripper portions, means for moving said bifurcate member in a predetermined path between first and second limiting positions respectively adjacent and spaced from said board, stripper blade means moveably mounted in said path between the tines of said bifurcate member between first and second limiting positions respectively toward and away from said board, said blade means being positioned to engage a component held in said gripper portions in said second limiting position of said bifurcate member and said blade, and means for moving said blade means and bifurcate member conjointly in said path toward said board and for moving said bifurcate means in advance of said blade means in said path away from said board.

11. Apparatus in accordance with claim 10 wherein said means for inserting a component comprises timed lateral feed means for shifting a said component into said path in advance of movement of said bifurcate member from said first to said second limiting position.

12. Apparatus in accordance with claim 11 wherein said timed feed means acts to move said component into said path after movement of said blade means from said first to said second position and said blade means functions as a stop to force a said component into mounted position between said gripper portions during final return movement of said bifurcate means from said first to said second limiting positions.

* * * * *